US012616051B2

(12) United States Patent
Milton et al.

(10) Patent No.: US 12,616,051 B2
(45) Date of Patent: \*Apr. 28, 2026

(54) METHODS A SEQUENCE FOR A PLURALITY OF WIRE LOOPS IN CONNECTION WITH A WORKPIECE

(71) Applicant: KULICKE AND SOFFA INDUSTRIES, INC., Fort Washington, PA (US)

(72) Inventors: Basil Milton, Furlong, PA (US); David Jeffery Li, Philadelphia, PA (US); Wei Qin, Ambler, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/952,116

(22) Filed: Nov. 19, 2024

(65) Prior Publication Data

US 2025/0079396 A1 Mar. 6, 2025

Related U.S. Application Data

(63) Continuation of application No. 18/109,344, filed on Feb. 14, 2023, now Pat. No. 12,183,711.

(Continued)

(51) Int. Cl.
 *H10W 72/00* (2026.01)
 *B23K 20/00* (2006.01)
 (Continued)

(52) U.S. Cl.
 CPC ........... *H10W 72/075* (2026.01); *B23K 20/00* (2013.01); *H10W 72/50* (2026.01);
 (Continued)

(58) Field of Classification Search
 None
 See application file for complete search history.

(56) References Cited

U.S. PATENT DOCUMENTS 5,647,527 A 7/1997 Oyachi
6,080,651 A 6/2000 Takahashi et al.
 (Continued)

FOREIGN PATENT DOCUMENTS

JP 09-115941 A 5/1997
WO 2011163441 A2 12/2011

OTHER PUBLICATIONS

International Search Report for PCT Application No. PCT/2023/012981 completed Jun. 12, 2023.

*Primary Examiner* — Devang R Patel
(74) *Attorney, Agent, or Firm* — Christopher M. Spletzer, Sr.

(57) ABSTRACT

A method of determining a sequence for creating a plurality of wire loops is provided. The method includes (a) providing workpiece data for a workpiece. The workpiece data includes (i) position data for bonding locations of the workpiece, and (ii) wire loop data for a plurality of wire loops providing interconnection between ones of the bonding locations. The method also includes (b) analyzing the workpiece data. The step of analyzing includes considering overlap conditions between ones of the plurality of wire loops, considering wire loop heights of ones of the plurality of wire loops, considering lateral bend conditions between ones of the plurality of wire loops, and considering wire loop positions for ones of the plurality of wire loops. The method also includes (c) providing a sequence of creating the plurality of wire loops in connection with the workpiece at least partially based on the results of step (b).

20 Claims, 4 Drawing Sheets

Related U.S. Application Data

(60) Provisional application No. 63/310,200, filed on Feb. 15, 2022.

(51) Int. Cl.
*H10W 72/50* (2026.01)
*H10W 90/00* (2026.01)

(52) U.S. Cl.
CPC *H10W 72/07531* (2026.01); *H10W 72/07553* (2026.01); *H10W 72/07554* (2026.01); *H10W 72/5366* (2026.01); *H10W 72/537* (2026.01); *H10W 72/5445* (2026.01); *H10W 90/756* (2026.01)

(56) References Cited

U.S. PATENT DOCUMENTS

| | | |
|---|---|---|
| 6,812,580 B1 | 11/2004 | Wenzel et al. |
| 7,683,480 B2 | 3/2010 | Bokatius et al. |
| 8,302,840 B2 | 11/2012 | Qin et al. |
| 8,312,404 B2 | 11/2012 | Hu et al. |
| 9,496,240 B2 | 11/2016 | Qin et al. |
| 9,502,371 B2 | 11/2016 | Colosimo, Jr. et al. |
| 10,325,878 B2 | 6/2019 | Milton et al. |
| 12,183,711 B2 * | 12/2024 | Milton .................... H01L 24/85 |
| 2003/0011038 A1 | 1/2003 | Kida |
| 2005/0173491 A1 | 8/2005 | Kim et al. |
| 2008/0111252 A1 * | 5/2008 | Qin ..................... B23K 20/007 257/784 |
| 2012/0024089 A1 | 2/2012 | Couey et al. |
| 2012/0074206 A1 | 3/2012 | Qin et al. |

* cited by examiner

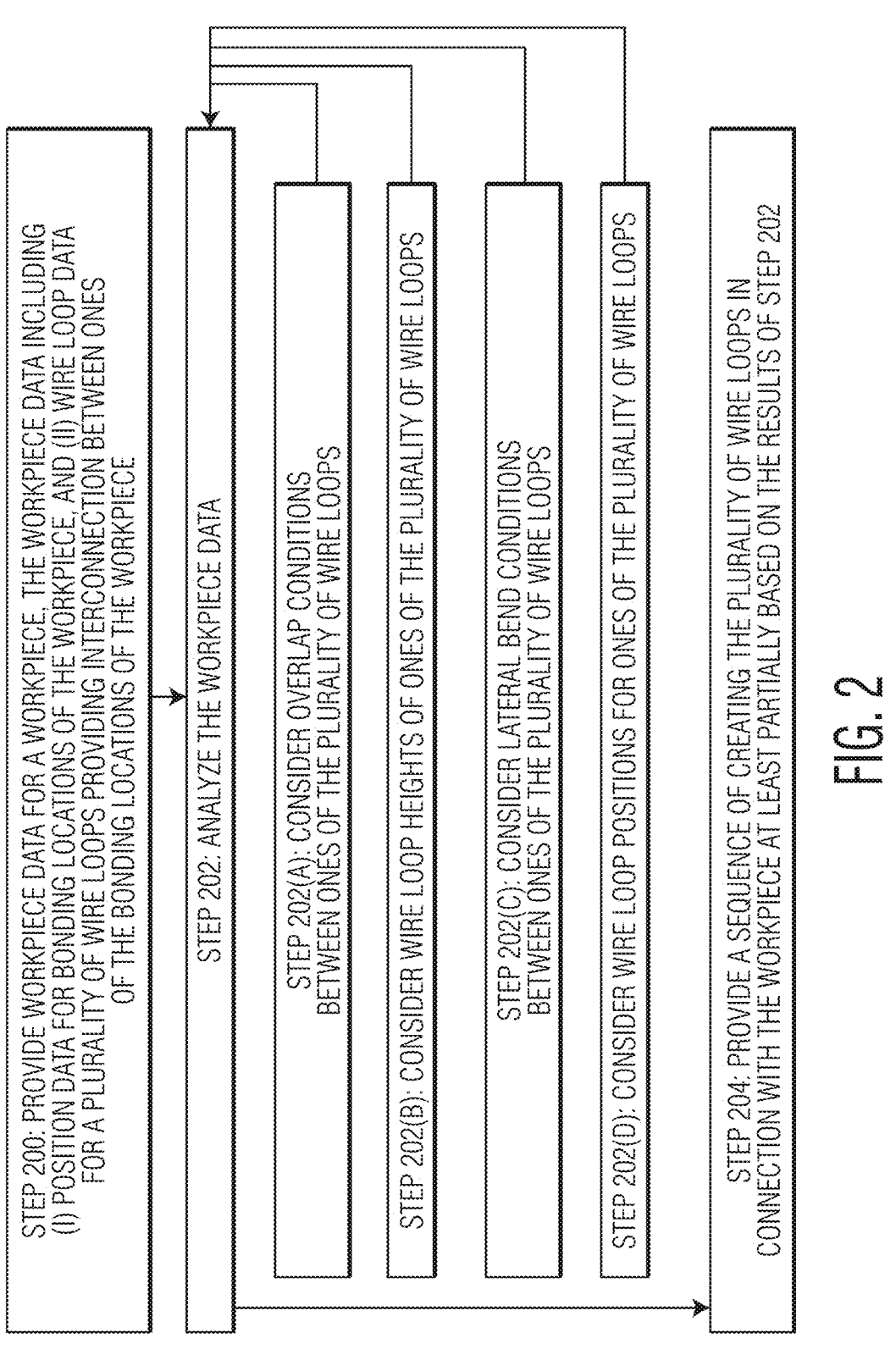

STEP 200: PROVIDE WORKPIECE DATA FOR A WORKPIECE, THE WORKPIECE DATA INCLUDING (I) POSITION DATA FOR BONDING LOCATIONS OF THE WORKPIECE, AND (II) WIRE LOOP DATA FOR A PLURALITY OF WIRE LOOPS PROVIDING INTERCONNECTION BETWEEN ONES OF THE BONDING LOCATIONS OF THE WORKPIECE

STEP 202: ANALYZE THE WORKPIECE DATA

STEP 202(A): CONSIDER OVERLAP CONDITIONS BETWEEN ONES OF THE PLURALITY OF WIRE LOOPS

STEP 202(B): CONSIDER WIRE LOOP HEIGHTS OF ONES OF THE PLURALITY OF WIRE LOOPS

STEP 202(C): CONSIDER LATERAL BEND CONDITIONS BETWEEN ONES OF THE PLURALITY OF WIRE LOOPS

STEP 202(D): CONSIDER WIRE LOOP POSITIONS FOR ONES OF THE PLURALITY OF WIRE LOOPS

STEP 204: PROVIDE A SEQUENCE OF CREATING THE PLURALITY OF WIRE LOOPS IN CONNECTION WITH THE WORKPIECE AT LEAST PARTIALLY BASED ON THE RESULTS OF STEP 202

FIG. 2

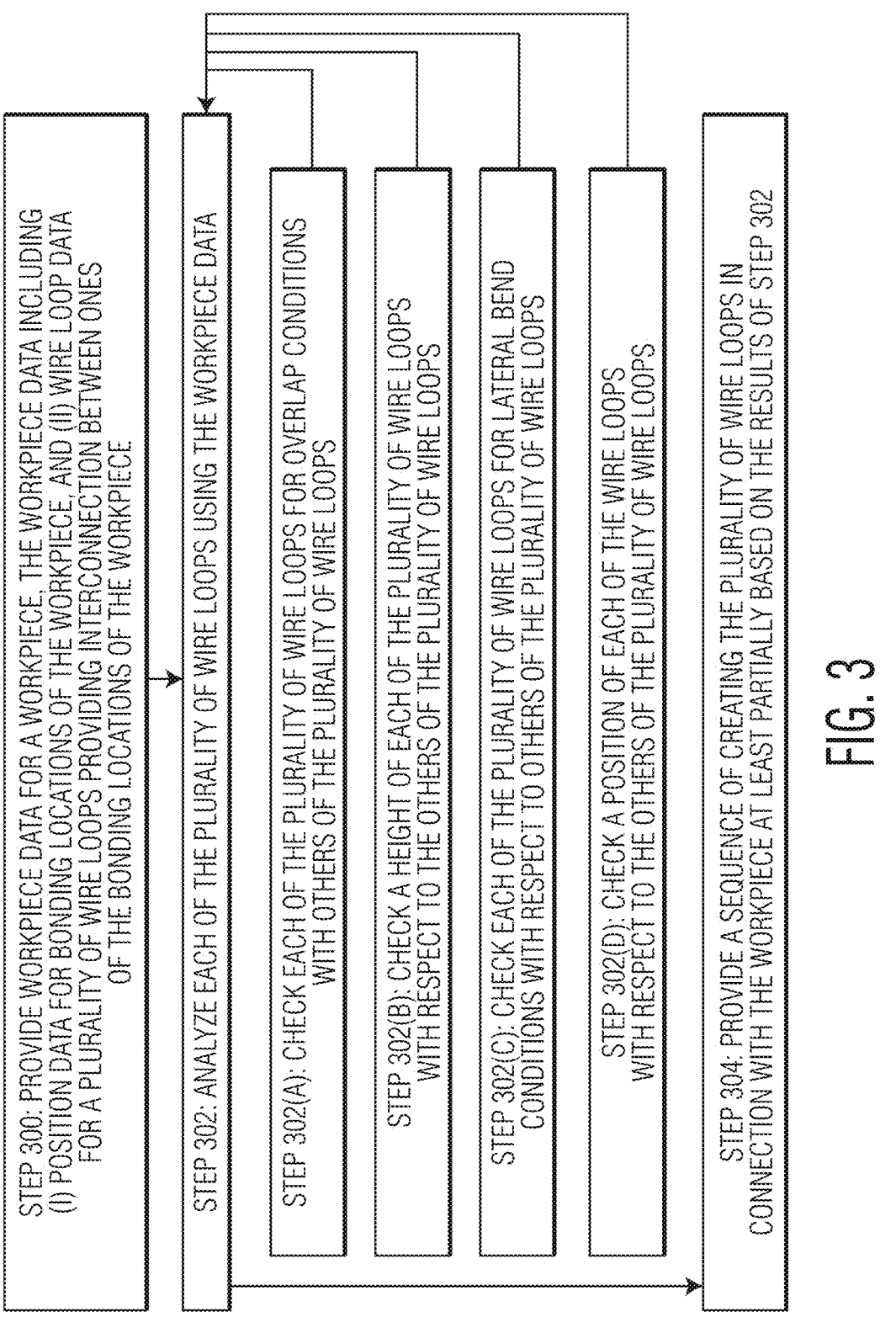

STEP 300: PROVIDE WORKPIECE DATA FOR A WORKPIECE, THE WORKPIECE DATA INCLUDING (I) POSITION DATA FOR BONDING LOCATIONS OF THE WORKPIECE, AND (II) WIRE LOOP DATA FOR A PLURALITY OF WIRE LOOPS PROVIDING INTERCONNECTION BETWEEN ONES OF THE BONDING LOCATIONS OF THE WORKPIECE

STEP 302: ANALYZE EACH OF THE PLURALITY OF WIRE LOOPS USING THE WORKPIECE DATA

STEP 302(A): CHECK EACH OF THE PLURALITY OF WIRE LOOPS FOR OVERLAP CONDITIONS WITH OTHERS OF THE PLURALITY OF WIRE LOOPS

STEP 302(B): CHECK A HEIGHT OF EACH OF THE PLURALITY OF WIRE LOOPS WITH RESPECT TO THE OTHERS OF THE PLURALITY OF WIRE LOOPS

STEP 302(C): CHECK EACH OF THE PLURALITY OF WIRE LOOPS FOR LATERAL BEND CONDITIONS WITH RESPECT TO OTHERS OF THE PLURALITY OF WIRE LOOPS

STEP 302(D): CHECK A POSITION OF EACH OF THE WIRE LOOPS WITH RESPECT TO THE OTHERS OF THE PLURALITY OF WIRE LOOPS

STEP 304: PROVIDE A SEQUENCE OF CREATING THE PLURALITY OF WIRE LOOPS IN CONNECTION WITH THE WORKPIECE AT LEAST PARTIALLY BASED ON THE RESULTS OF STEP 302

FIG. 3

METHODS A SEQUENCE FOR A PLURALITY OF WIRE LOOPS IN CONNECTION WITH A WORKPIECE

CROSS-REFERENCE TO RELATED APPLICATION

This application is as continuation of U.S. patent application Ser. No. 18/109,344 filed Feb. 14, 2023, which claims the benefit of U.S. Provisional Application No. 63/310,200, filed on Feb. 15, 2022, the content of both of which is incorporated herein by reference.

FIELD

The invention relates to the creation of wire loops, and more particularly, to methods of determining a sequence for creating a plurality of wire loops in connection with a workpiece.

BACKGROUND

Wire bonding machines are used to form wire loops between respective locations to be electrically interconnected. Exemplary wire bonding techniques include ball bonding and wedge bonding. Steps in a typical ball bonding application include: bonding a free air ball to a first bond location of a workpiece (e.g., a die pad of a semiconductor die); extending a length of wire continuous with the bonded free air ball to a second bond location of the workpiece (e.g., a lead of a leadframe); and bonding the wire to the second bond location, thereby forming a wire loop between the first bond location and the second bond location. In forming the bonds between (a) the ends of the wire loop and (b) the bond sites (e.g., die pads, leads, etc.) varying types of bonding energy may be used including, for example, ultrasonic energy, thermosonic energy, thermo-compressive energy, amongst others.

Many developments have been made in connection with the optimization of wire looping and/or wire bonding processes. Exemplary developments are described in: U.S. Pat. No. 10,325,878 (entitled "METHODS FOR GENERATING WIRE LOOP PROFILES FOR WIRE LOOPS, AND METHODS FOR CHECKING FOR ADEQUATE CLEARANCE BETWEEN ADJACENT WIRE LOOPS"); U.S. Pat. No. 9,496,240 (entitled "SYSTEMS AND METHODS FOR OPTIMIZING LOOPING PARAMETERS AND LOOPING TRAJECTORIES IN THE FORMATION OF WIRE LOOPS"); U.S. Pat. No. 8,302,840 (entitled "CLOSED LOOP WIRE BONDING METHODS AND BONDING FORCE CALIBRATION"); and U.S. Patent Application Publication No. 2012/0074206 (entitled "METHODS OF FORMING WIRE BONDS FOR WIRE LOOPS AND CONDUCTIVE BUMPS").

It would be desirable to provide improved methods of forming a plurality of wire loops in connection with a workpiece, including providing a sequence for efficiently forming the plurality of wire loops.

SUMMARY

According to an exemplary embodiment of the invention, a method of determining a sequence for creating a plurality of wire loops in connection with a workpiece is provided. The method includes the step of (a) providing workpiece data for a workpiece. The workpiece data includes (i) position data for bonding locations of the workpiece, and (ii)

wire loop data for a plurality of wire loops providing interconnection between ones of the bonding locations of the workpiece. The method further includes the step of (b) analyzing the workpiece data. The step of analyzing includes substeps of (b1) considering overlap conditions between ones of the plurality of wire loops, (b2) considering wire loop heights of ones of the plurality of wire loops, (b3) considering lateral bend conditions between ones of the plurality of wire loops, and (b4) considering wire loop positions for ones of the plurality of wire loops. The method further includes the step of (c) providing a sequence of creating the plurality of wire loops in connection with the workpiece at least partially based on the results of step (b). As will be appreciated by those skilled in the art, the "ones" of the plurality of wire loops described in each of substeps (b1)-(b4) are not necessarily the same.

According to another exemplary embodiment of the invention, a method of determining a sequence for creating a plurality of wire loops in connection with a workpiece is provided. The method includes the step of (a) providing workpiece data for a workpiece. The workpiece data includes (i) position data for bonding locations of the workpiece, and (ii) wire loop data for a plurality of wire loops providing interconnection between ones of the bonding locations of the workpiece. The method further includes the step of (b) analyzing each of the plurality of wire loops using the workpiece data. The step of analyzing includes substeps of (b1) checking each of the plurality of wire loops for overlap conditions with others of the plurality of wire loops, (b2) checking a height of each of the plurality of wire loops with respect to others of the plurality of wire loops, (b3) checking each of the plurality of wire loops for lateral bend conditions with respect to others of the plurality of wire loops, and (b4) checking a position of each of the wire loops with respect to others of the plurality of wire loops. The method further includes the step of (c) providing a sequence of creating the plurality of wire loops in connection with the workpiece at least partially based on the results of step (b).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 2 is a flow diagram illustrating a method of determining a sequence for creating a plurality of wire loops in connection with a workpiece in accordance with an exemplary embodiment of the invention; and FIG. 3 is a flow diagram illustrating another method of determining a sequence for creating a plurality of wire loops in connection with a workpiece in accordance with another exemplary embodiment of the invention.

DETAILED DESCRIPTION

Figure 1A:
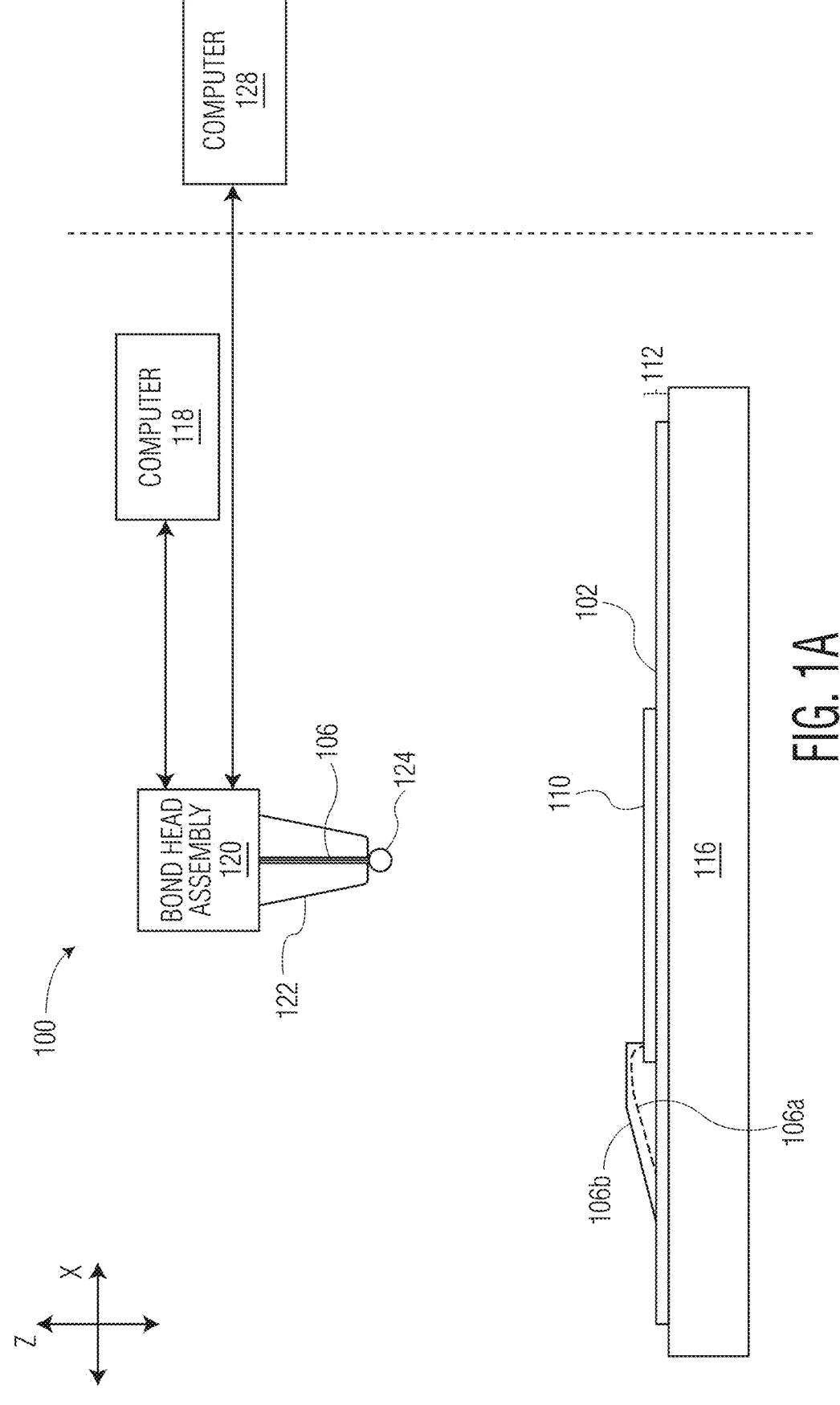
FIG. 1A is a block diagram side view of a wire bonding machine during the formation of a plurality of wire loops useful for performing methods in accordance with various exemplary embodiments of the invention.

In connection with wire bonding on a workpiece (e.g., a semiconductor package), wire loops may be checked for clearance, and wire loop shapes may be optimized, for example, using techniques described in U.S. Pat. Nos. 10,325,878 and 9,496,240. After the specific parameters for forming the wire loops are determined, the wire loops can be assigned a desired wire bond sequence (e.g., the sequence of forming the plurality of wire loops in the semiconductor package). Conventional approaches to assigning a sequence of forming wire loops tend to involve manual processes and rely heavily on the experience of a user (e.g., a process engineer, a technician, etc.). These manual processes tend to be very laborious and time consuming.

Aspects of the invention provide a solution whereby a sequence of forming wire loops is automatically assigned (e.g., by analyzing predetermined criteria in connection with workpiece data), thereby improving productivity. More importantly, the ambiguity around several possible sequences may be reduced to provide a more effective solution. Aspects of the method involve using (a) the 2D and/or 3D shapes of various wire loops and (b) their spatial orientation with respect to each other, as inputs, to determine the correct wire bond sequence (output). A directed graph data structure (or data structures) may be used, wherein each wire loop is represented by a vertex in the graph and a directed edge indicates the bonding order. Several comparison functions may then be applied to incorporate various wire bond sequence rules, thereby determining the wire bond sequence.

Certain "rules" are considered (e.g., in connection with an automatic process, by software in one or more algorithms) in connection with the determination of an appropriate sequence for forming a plurality of wire loops. These "rules" are not absolute, but rather they are considerations. Examples of these rules include: (a) one or more "ground" wires are typically bonded first (e.g., for electrostatic discharge reasons); (b) wire loops having a lower loop height are typically formed prior to wire loops having a taller loop height; (c) wire loops having a shorter length are typically formed prior to wire loops having a longer length; (d) bond wires "corner in" when wire angle affects the pitch of the wire loop, and may cause interference, which should be considered accordingly; (e) wire loops bonded to an outer pad tier of a semiconductor die are typically formed prior to wire loops bonded to an inner pad tier (and if there are dependencies on successive inner tiers, then the dependencies are typically sequenced in the current tier); (f) for adjacent wire loops bonded to the same bonding location, a wire loop without a lateral bend is typically formed first, followed by a wire loop with a lateral bend; (g) for adjacent wire loops bonded to different bonding locations, a wire loop with a lateral bend is typically bonded first, followed by a wire loop without a lateral bend; and (h) consider first and second bond locations of a wire loop, for example, a second bond location adjustment may be appropriate in certain instances (e.g., if the location change does not adversely affect the package and the wire bonding process).

One or more computers (e.g., and associated algorithm(s)) may be used to determine (e.g., as part of an automated process) the sequences of forming/creating a plurality of wire loops as described herein. For example, FIG. 1A illustrates a computer 118 that is part of a wire bonding machine 100, and another computer 128 that is not part of wire bonding machine 100. Either, or both, of computers 118, 128 may be used in connection with the steps of analyzing workpiece data and providing a sequence of creating a plurality of wire loops at least partially based on the analysis of the workpiece data.

In consideration of the sequence of forming wire loops, workpiece data is provided and analyzed. Such workpiece data includes (i) position data for bonding locations of the workpiece and (ii) wire loop data for a plurality of wire loops providing interconnection between ones of the bonding locations of the workpiece. In connection with the analysis of the workpiece data, certain considerations tend to be more important than others. For example, in certain embodiments of the invention, the analysis of the workpiece data includes: (i) considering overlap conditions between ones of the plurality of wire loops; (ii) considering wire loop heights of ones of the plurality of wire loops; (iii) considering lateral bend conditions between ones of the plurality of wire loops; and (iv) considering wire loop positions for ones of the plurality of wire loops.

Regarding the overlap conditions between ones of the plurality of wire loops: overlapping (or crossing) wires refer to wires that are intersecting in two-dimensional (2D) space (e.g., one wire passes over/under another wire when viewed from above). Wires that are not intersecting in 2D space may not have any dependency for wire sequence assignment. Wires that are crossing in 2D space require wire sequence assignment.

Regarding wire loop heights of ones of the plurality of wire loops: wire loop height typically refers to the maximum height of a wire loop across its entire length. For a set of wires intersecting in 2D space, the wire loop height tends to determine the order (i.e., sequence) of formation of wire loops. Further, wire loops having a lower loop height tend to be formed before wire loops having a taller loop height.

Regarding lateral bend conditions between ones of the plurality of wire loops: lateral bends refer to intentional kinks in a wire loop that deviate the wire from a direct path connecting a first bonding location and a second bonding location. Lateral bends are generally applied to improve clearance from adjacent wires. An impact to a sequence of forming wire loops tends to be determined by the direction in which the lateral bend is applied.

Regarding wire loop positions for ones of the plurality of wire loops: XY coordinates of starting points (e.g., $1^{st}$ bond) and end points (e.g., $2^{nd}$ bond) of a wire loop determines the wire position. Wire positions relative to one another help to derive efficient sequences for forming a plurality of wire loops, for example, in terms of speed or throughput.

In certain embodiments of the invention, the result of a first consideration (e.g., a first check) may be used as an input for a further consideration. In a specific example, loop heights for certain wire loops may be used in connection with a consideration of overlapping wire loops.

Referring now to FIG. 1A, a wire bonding machine 100 and a computer 128 (external to wire bonding machine 100) are illustrated. Wire bonding machine 100 includes a bond head assembly 120, a support structure 116, and a computer 118. Computer 128 is located separate from wire bonding machine 100. Bond head assembly 120 is illustrated carrying a wire bonding tool 122. A wire 106 is illustrated through wire bonding tool 122, terminating at a free air ball (FAB) 124, in preparation for a wire bonding operation. Support structure 116 of wire bonding machine 100 is illustrated supporting a workpiece 112. In the illustrated example, workpiece 112 includes a substrate 102 (e.g., a leadframe) and a die 110 (e.g., a semiconductor die). A wire loop 106a and a wire loop 106b are illustrated providing electrical interconnection between die 110 and substrate 102. Wire loop 106a and wire loop 106b are illustrated having different loop heights (i.e., wire loop 106a having a "lower" height than wire loop 106*b*). In such an example, wire loop 106*a* would likely be formed prior to wire loop 106*b*.

Figure 1B:
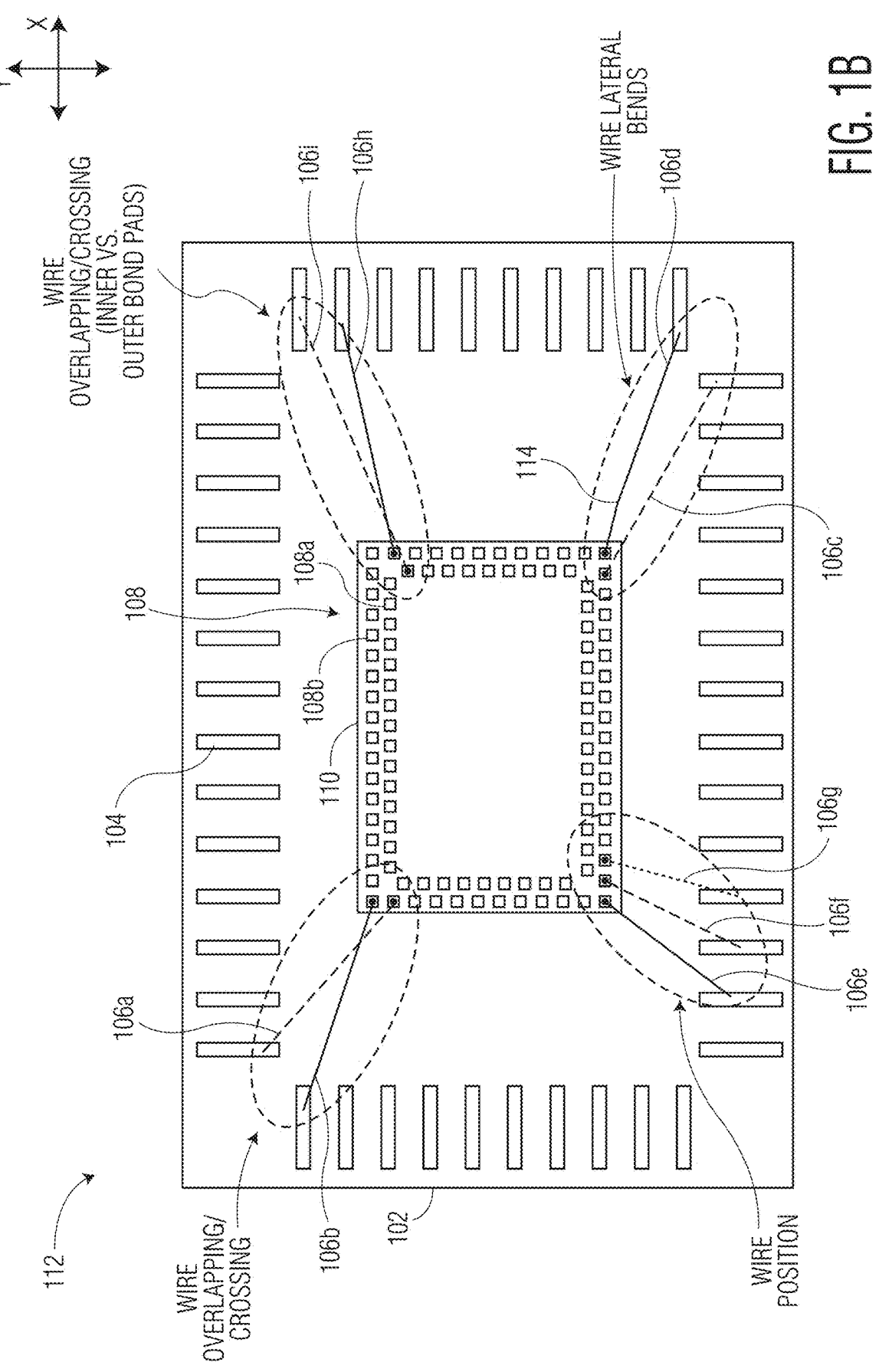
FIG. 1B is an overhead block diagram view of a workpiece including a plurality of wire loops useful for explaining methods in accordance with various exemplary embodiments of the invention.

Referring now to FIG. 1B, a plan view of a workpiece 112 (including a die 110 and a substrate 102, as in FIG. 1A) is illustrated. Die 110 is illustrated having a plurality of bond sites 108 (e.g., die pads), including inner bond sites 108*a* (i.e., bond sites located relatively closer to the center of die 110) and outer bond sites 108*b* (i.e., bond sites located relatively closer to the edges of die 110). Substrate 102 is illustrated having a plurality of bond sites 104 (e.g., leads of a leadframe). In FIG. 1B, a plurality of wire loops has been formed on workpiece 112.

Considering wire loops 106*a* and 106*b* (in the upper left section of FIG. 1B): wire loop 106*a* is illustrated having been formed and providing electrical interconnection between a bond site 108 (i.e., an outer bond site 108*b*) and a bond site 104; and wire loop 106*b* is illustrated having been formed (after wire loop 106*a*) and providing electrical interconnection between another bond site 108 (i.e., an outer bond site 108*b*) and another bond site 104. Wire loops 106*a* and 106*b* are considered "overlapping" or "crossing" wire loops. Wire loops 106*a* and 106*b* are also at different heights (see illustration in FIG. 1A). With the loop height information of wire loops 106*a* and 106*b* (e.g., because wire loop 106*a* has a lower loop height than wire loop 106*b*), and the overlap condition between wire loops 106*a* and 106*b*, wire loop 106*a* should be formed prior to wire loop 106*b*.

In a further consideration, a wires loop 106*c* and a wire loop 106*d* are illustrated having been formed between respective bond sites 108 and corresponding bond sites 104 (see the lower right section of FIG. 1B). Wire loop 106*d* is illustrated having a bend 114 and, more specifically, a "lateral bend" (e.g., bent substantially within the XY plane). With the lateral bend condition between wire loops 106*c* and 106*d*, wire loop 106*d* should likely be formed prior to wire loop 106*c* because wire loops 106*c* and 106*d* will be bonded to different bonding locations (i.e., different bond sites 104, such as leads of a leadframe)

In another further consideration, wire loops 106*e*, 106*f* and 106*g* are illustrated having been formed between respective bond sites 108 and corresponding bond sites 104 (see the lower left section of FIG. 1B). Wire loops 106*e*, 106*f* and 106*g* are illustrated in different positions. To improve a time efficiency in connection with the creation of wire loops 106*e*, 106*f*, and 106*g*, wire loops 106*e*, 106*f*, and 106*g* are formed either left to right (e.g., wire loop 106*e*, then wire loop 106*f*, and then 106*g*) or right to left (e.g., wire loop 106*g*, then wire loop 106*f*, and then wire loop 106*e*).

In another further consideration, a wire loop 106*i* is illustrated having been formed from an inner bond site 108*a* to a corresponding bond site 104 (see the upper right section of FIG. 1B). A wire loop 106*h* is illustrated having been formed from an outer bond site 108*b* to a corresponding bond site 104. Wire loops 106*i* and 106*h* are considered "overlapping" or "crossing". Because wire loop 106*h* is bonded to an outer pad tier (including the outer bond site 108*b*), as compared to wire loop 106*i* which is bonded to an inner pad tier (including the inner bond site 108*a*), wire loop 106*h* should likely be formed before wire loop 106*i*.

These considerations described in connection with FIGS. 1A-1B are examples of the types of considerations made in order to determine an appropriate sequence for forming a plurality of wire loops in connection with workpiece 112. Of course, this is a simple example. In other words, many unillustrated wire loops may be formed on workpiece 112, with various conditions as described (e.g., overlapping wire loops, etc.). Workpieces including many wire loops may utilize the methods described herein. Thus, certain "rules" may have to be prioritized as compared to other rules in order to find an efficient and desirable sequence for forming a plurality of wire loops in connection with a workpiece.

FIG. 2 and FIG. 3 are flow diagrams illustrating methods of determining sequences (e.g., automatically determining, for example, using one or more computers) for creating a plurality of wire loops in connection with a workpiece. As is understood by those skilled in the art, certain steps included in the flow diagrams may be omitted; certain additional steps may be added; and the order of the steps (or "substeps") may be altered from the order illustrated—all within the scope of the invention.

Referring specifically to FIG. 2, at Step 200, workpiece data for a workpiece is provided. The workpiece data includes (i) position data for bonding locations of the workpiece, and (ii) wire loop data for a plurality of wire loops providing interconnection between ones of the bonding locations of the workpiece. For example, the wire loop data may include at least one of a two-dimensional shape and a three-dimensional shape of ones of the plurality of wire loops, and the orientation of ones of the plurality of wire loops with respect to each other. Step 200 may also include assembling the workpiece data in a data structure accessible by a computer (e.g., see computer 118 and/or computer 128 shown in FIG. 1A).

At Step 202, the workpiece data is analyzed. The analyzing of Step 202 includes the substeps of Step 202(*a*), Step 202(*b*), Step 202(*c*), and Step 202(*d*). At Step 202(*a*), overlap conditions between ones of the plurality of wire loops are considered. At Step 202(*b*), wire loop heights of ones of the plurality of wire loops are considered. At Step 202(*c*), lateral bend conditions between ones of the plurality of wire loops are considered. At Step 202(*d*), wire loop positions for ones of the plurality of wire loops are considered. Step 202 may be performed using a computer (e.g., computer 118, 128 illustrated in FIG. 1A). Such a computer may be on a wire bonding machine (e.g., computer 118) or separate from a wire bonding machine (e.g., computer 128). Step 202 may be performed using an algorithm running on a computer.

The workpiece data may be analyzed in Step 202 by giving a priority to each of substeps Step 202(*a*), Step 202(*b*), Step 202(*c*), and Step 202(*d*) with respect to each other. For example, such priority may be a preference of one consideration (e.g., and associated rules) over another in absolute terms, in weighted terms, etc.

In a specific example, the results of Step 202(*a*) may be given priority over a result of Steps 202(*b*), 202(*c*), and 202(*d*). Likewise, the results of Step 202(*b*) may be given priority over a result of Steps 202(*c*) and 202(*d*). Likewise, the results of Step 202(*c*) may be given priority over a result of Step 202(*d*).

Further, Step 202 may include another step of accounting for time efficiency in connection with the creation of the plurality of wire loops.

At Step 204, a sequence of creating the plurality of wire loops is provided in connection with the workpiece at least partially based on the results of Step 202. Step 204 may include determining the sequence of creating the plurality of wire loops such that ground wires included in the plurality of wire loops are created prior to the creation of other of the plurality of wire loops. Further, the sequence may be determined such that the plurality of wire loops can be created without interference with adjacent ones of the plurality of wire loops. Step 204 may be performed using a computer (e.g., computer 118, 128 illustrated in FIG. 1A). Such a computer may be on a wire bonding machine (e.g., computer 118) or separate from a wire bonding machine (e.g., computer 128). Step 204 may be performed using an algorithm running on a computer.

As will be understood by those skilled in the art, the analysis of the workpiece data in Step 202 could include different and/or additional considerations than those described above.

Referring specifically to FIG. 3, in Step 300, workpiece data for a workpiece is provided. The workpiece data includes (i) position data for bonding locations of the workpiece, and (ii) wire loop data for a plurality of wire loops providing interconnection between ones of the bonding locations of the workpiece. For example, the wire loop data may include at least one of a two-dimensional shape and a three-dimensional shape of ones of the plurality of wire loops, and the orientation of ones of the plurality of wire loops with respect to each other. Step 300 may also include assembling the workpiece data in a data structure accessible by a computer (e.g., see computer 118 and/or computer 128 shown in FIG. 1A).

At Step 302, each of the plurality of wire loops are analyzed using the workpiece data. The analyzing of Step 302 includes the substeps of Step 302(*a*), Step 302(*b*), Step 302(*c*), and Step 302(*d*). At Step 302(*a*), each of the plurality of wire loops are checked for overlap conditions with others of the plurality of wire loops. At Step 302(*b*), a height of each of the plurality of wire loops is checked with respect to others of the plurality of wire loops. At Step 302(*c*), each of the plurality of wire loops are checked for lateral bend conditions with respect to others of the plurality of wire loops. At Step 302(*d*), a position of each of the wire loops is checked with respect to others of the plurality of wire loops. Step 302 may be performed using a computer (e.g., computer 118, 128 illustrated in FIG. 1A). Such a computer may be on a wire bonding machine (e.g., computer 118) or separate from a wire bonding machine (e.g., computer 128). Step 302 may be performed using an algorithm running on a computer.

The workpiece data may be analyzed in Step 302 by giving a priority to each of substeps Step 302(*a*), Step 302(*b*), Step 302(*c*), and Step 302(*d*) with respect to each other. For example, such priority may be a preference of one check (e.g., and associated rules) over another in absolute terms, in weighted terms, etc.

In a specific example, the results of Step 302(*a*) may be given priority over a result of Steps 302(*b*), 302(*c*), and 302(*d*). Likewise, the results of Step 302(*b*) may be given priority over a result of Steps 302(*c*) and 302(*d*). Likewise, the results of Step 302(*c*) may be given priority over a result of Step 302(*d*).

Further, Step 302 may include another step of accounting for time efficiency in connection with the creation of the plurality of wire loops.

At Step 304, a sequence of creating the plurality of wire loops is provided in connection with the workpiece at least partially based on the results of Step 302. Step 304 may include determining the sequence of creating the plurality of wire loops such that ground wires included in the plurality of wire loops are created prior to the creation of other of the plurality of wire loops. Further, the sequence may be determined such that the plurality of wire loops can be created without interference with adjacent ones of the plurality of wire loops. Step 304 may be performed using a computer (e.g., computer 118, 128 illustrated in FIG. 1A). Such a computer may be on a wire bonding machine (e.g., computer

118) or separate from a wire bonding machine (e.g., computer 128). Step 304 may be performed using an algorithm running on a computer.

As will be understood by those skilled in the art, the analysis of the workpiece data in Step 302 could include different and/or additional considerations than those described above.

In connection with a determining a sequence of forming a plurality of wire loops, the sequence of forming the wire bonds (e.g., the first bond of a wire loop formed at one location, followed by forming a second bond of the wire loop at another location) in each of the plurality of wire loops may also be considered. As will be appreciated by those skilled in the art, each wire loop may include multiple bonded portions along the length of the wire loop. In some instances, a single bonded portion may be included (e.g., see U.S. Pat. No. 9,502,371 entitled "METHODS OF FORMING WIRE INTERCONNECT STRUCTURES).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of determining a sequence for creating a plurality of wire loops in connection with a workpiece, the method comprising the steps of:

(a) providing workpiece data for the workpiece, the workpiece data including (i) position data for bonding locations of the workpiece, and (ii) wire loop data for the plurality of wire loops providing interconnection between ones of the bonding locations of the workpiece, the wire loop data including a three-dimensional shape of each of the plurality of wire loops;

(b) analyzing the workpiece data, the step of analyzing including substeps of (b1) considering overlap conditions between ones of the plurality of wire loops, (b2) considering wire loop heights of ones of the plurality of wire loops, (b3) considering lateral bend conditions between ones of the plurality of wire loops, and (b4) considering wire loop positions for ones of the plurality of wire loops, wherein step (b) includes analyzing the workpiece data by prioritizing substeps (b1)-(b4) with respect to each other; and (c) providing the sequence of creating the plurality of wire loops in connection with the workpiece at least partially based on the results of step (b), wherein the workpiece includes a semiconductor die, and wherein the sequence includes forming ones of the plurality of wire loops being bonded to an outer pad tier of the semiconductor die prior to forming others of the plurality of wire loops being bonded to an inner pad tier of the semiconductor die.

2. The method of claim 1 wherein steps (b) and (c) are performed using a computer on a wire bonding machine.

3. The method of claim 1 wherein steps (b) and (c) are performed using a computer separate from a wire bonding machine.

4. The method of claim 1 wherein steps (b) and (c) are performed using an algorithm running on a computer.

5. The method of claim 1 wherein step (a) includes assembling the workpiece data in a data structure accessible by a computer.

6. The method of claim 1 wherein a result of substep (b1) is given priority over a result of substeps (b2)-(b4).

7. The method of claim 6 wherein a result of substep (b2) is given priority over a result of substeps (b3)-(b4).

8. The method of claim 7 wherein a result of substep (b3) is given priority over a result of substep (b4).

9. The method of claim 1 wherein step (c) includes providing the sequence such that the plurality of wire loops are created without interference with adjacent ones of the plurality of wire loops.

10. The method of claim 1 wherein the step of analyzing further includes the substep of (b5) accounting for time efficiency in connection with the creation of the plurality of wire loops.

11. A method of determining a sequence for creating a plurality of wire loops in connection with a workpiece, the method comprising the steps of:

(a) providing workpiece data for the workpiece, the workpiece data including (i) position data for bonding locations of the workpiece, and (ii) wire loop data for the plurality of wire loops providing interconnection between ones of the bonding locations of the workpiece, the wire loop data including a three-dimensional shape of each of the plurality of wire loops;

(b) analyzing each of the plurality of wire loops to be created using the workpiece data, the step of analyzing including substeps of (b1) checking each of the plurality of wire loops for overlap conditions with others of the plurality of wire loops, (b2) checking a height of each of the plurality of wire loops with respect to others of the plurality of wire loops, (b3) checking each of the plurality of wire loops for lateral bend conditions with respect to others of the plurality of wire loops, and (b4) checking a position of each of the wire loops with respect to others of the plurality of wire loops, wherein step (b) includes analyzing the workpiece data by prioritizing substeps (b1)-(b4) with respect to each other; and (c) providing the sequence of creating the plurality of wire loops in connection with the workpiece at least partially based on the results of step (b), wherein the workpiece includes a semiconductor die, and wherein the sequence includes forming ones of the plurality of wire loops being bonded to an outer pad tier of the semiconductor die prior to forming others of the plurality of wire loops being bonded to an inner pad tier of the semiconductor die.

12. The method of claim 11 wherein steps (b) and (c) are performed using a computer on a wire bonding machine.

13. The method of claim 11 wherein steps (b) and (c) are performed using a computer separate from a wire bonding machine.

14. The method of claim 11 wherein steps (b) and (c) are performed using an algorithm running on a computer.

15. The method of claim 11 wherein step (a) includes assembling the workpiece data in a data structure accessible by a computer.

16. The method of claim 11 wherein a result of substep (b1) is given priority over a result of substeps (b2)-(b4).

17. The method of claim 16 wherein a result of substep (b2) is given priority over a result of substeps (b3)-(b4).

18. The method of claim 17 wherein a result of substep (b3) is given priority over a result of substep (b4).

19. The method of claim 11 wherein step (c) includes providing the sequence such that the plurality of wire loops are created without interference with adjacent ones of the plurality of wire loops.

20. The method of claim 11 wherein the step of analyzing further includes the substep of (b5) accounting for time efficiency in connection with the creation of the plurality of wire loops.

* * * * *